United States Patent
Lee et al.

(10) Patent No.: US 9,082,686 B2
(45) Date of Patent: Jul. 14, 2015

(54) SEMICONDUCTOR PACKAGE

(71) Applicant: SK hynix Inc., Icheon-si (KR)

(72) Inventors: Sang Eun Lee, Icheon-si (KR); Sung Soo Ryu, Seongnam-si (KR); Chang Il Kim, Busan (KR); Seon Kwang Jeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 13/798,800

(22) Filed: Mar. 13, 2013

(65) Prior Publication Data

US 2014/0117430 A1    May 1, 2014

(30) Foreign Application Priority Data

Oct. 25, 2012  (KR) .................. 10-2012-0118866

(51) Int. Cl.
| | | |
|---|---|---|
| H01L 29/40 | (2006.01) | |
| H01L 25/18 | (2006.01) | |
| H01L 23/31 | (2006.01) | |
| H01L 23/538 | (2006.01) | |
| H01L 25/065 | (2006.01) | |
| H01L 23/498 | (2006.01) | |

(52) U.S. Cl.
CPC ............ H01L 25/18 (2013.01); H01L 23/3128 (2013.01); H01L 23/5385 (2013.01); H01L 25/0652 (2013.01); H01L 23/49816 (2013.01); H01L 2224/16225 (2013.01); H01L 2224/32145 (2013.01); H01L 2224/32225 (2013.01); H01L 2224/45144 (2013.01); H01L 2224/48227 (2013.01); H01L 2224/73253 (2013.01); H01L 2224/73265 (2013.01); H01L 2224/9202 (2013.01); H01L 2225/0651 (2013.01); H01L 2225/06562 (2013.01); H01L 2924/15311 (2013.01)

(58) Field of Classification Search
None
See application file for complete search history.

(56) References Cited

U.S. PATENT DOCUMENTS

| | | | | |
|---|---|---|---|---|
| 7,176,506 | B2* | 2/2007 | Beroz et al. .................. | 257/232 |
| 7,855,441 | B2* | 12/2010 | Han .............................. | 257/678 |
| 7,919,871 | B2* | 4/2011 | Moon et al. .................. | 257/777 |
| 2002/0074668 | A1* | 6/2002 | Hofstee et al. ............... | 257/777 |
| 2008/0106860 | A1 | 5/2008 | Jafari et al. | |
| 2008/0236782 | A1* | 10/2008 | Alhayed et al. ............. | 165/41 |
| 2010/0244227 | A1* | 9/2010 | Kim et al. ..................... | 257/692 |
| 2011/0095424 | A1* | 4/2011 | Song et al. .................... | 257/738 |
| 2012/0086125 | A1* | 4/2012 | Kang et al. .................... | 257/738 |

* cited by examiner

*Primary Examiner* — Evan Pert
*Assistant Examiner* — Herve Assouman
(74) *Attorney, Agent, or Firm* — William Park & Associates Ltd.

(57) ABSTRACT

A semiconductor package includes a first substrate, a plurality of memory chips horizontally disposed on the first substrate, and having one surfaces which face the first substrate, other surfaces which face away from the one surfaces, and first bumps formed on the other surfaces, a second substrate disposed on the plurality of memory chips and electrically connected, a sub-substrate horizontally disposed on the first substrate together with the plurality of memory chips and electrically connecting the first substrate and the second substrate, and a driving chip having second bumps on one surface thereof and mounted to the second substrate such that the second bumps are electrically connected with the second substrate.

18 Claims, 7 Drawing Sheets

SEMICONDUCTOR PACKAGE

CROSS-REFERENCE TO RELATED APPLICATIONS

The present application claims priority to Korean Patent Application Number 10-2012-0118866 filed on Oct. 25, 2012 in the Korean Intellectual Property Office, which is incorporated herein by reference in its entirety.

BACKGROUND

1. Field of Invention

The present invention generally relates to a semiconductor package, and more particularly, to a semiconductor package which has a novel shape featuring a light, thin, compact, and miniaturized structure.

2. Description of the Related Art

The technology industry has provided products that feature light weight, miniaturization, and multi-functionality. One way this has been provided has been through a semiconductor package that incorporates a driving chip and a memory chip constructed in one module. Furthermore, the driving chip and the memory chip are fabricated as separate packages, and are either vertically or horizontally mounted on a mother board.

FIGS. 1 and 2 are cross-sectional views illustrating conventional semiconductor packages. FIG. 1 is a cross-sectional view illustrating a structure in which a driving package 10 and a memory package 20 are vertically stacked, and FIG. 2 is a cross-sectional view illustrating a structure in which a driving package 10 and a memory package 20 are horizontally mounted on a mother board 30.

However, when the driving package 10 and the memory package 20 are vertically stacked, a signal transfer path between the driving package 10 and the memory package 20 grows physically and in complexity which may cause problems, and when the driving package 10 and the memory package 20 are horizontally mounted on the mother board 30, the occupancy area of the mother board 30 increases, thereby adding difficulty to meet miniaturization demands.

Within the memory package 20, in order to realize a product that features a memory capacity capable of holding twice as much information compared to that of a single-chip memory, at least two memory chips 2 are stacked and connected with a substrate 3 via wires W. Subsequently, in order to protect the memory package 20, a molding part 5 is formed to seal the upper surface of the substrate 3 and the stacked memory chips 2.

Since wires W may have loops for preventing short-circuiting with peripheral components of the memory chips 2, the size of the memory package 20 increases due to the presence of the wire loops, which goes against the efforts of miniaturization. Also, a spacer 4 may be additionally formed between the stacked memory chips 2 to secure the height of the wire loops. As the number of stacked memory chips 2 increases, the height of the wire loops which are formed on the upper surface of the memory chip accordingly increases, thereby causing limitations in the number of memory chips 2 to be stacked. Moreover, as the number of stacked memory chips 2 increases, the length of wires W accordingly increases, which may cause problems such as wire sweeping, wire damage, and short-circuiting between peripheral components of the memory chips 2 and the wires W during a process for forming the molding part 5. In addition, since the wires W may be formed using gold, the package fabrication cost may substantially increase. In a memory chip such as a DRAM, which is fabricated to have a center pad structure, redistribution lines may be additionally formed to redistribute bonding pads to an edge of a chip for wire bonding, adding further complexity to the process. When grinding the memory chips 2 as thin as possible, although the number of memory chips 2 to be stacked may increase, failures such as warpage and cracking is likely to occur.

SUMMARY

Various embodiments are directed to a semiconductor package which has a novel shape featuring a light, thin, compact, and miniaturized structure.

In an embodiment, a semiconductor package may include: a first substrate, a plurality of memory chips horizontally disposed on the first substrate, and having one surfaces which face the first substrate, other surfaces which face away from the one surfaces, and first bumps formed on the other surfaces, a second substrate disposed on the plurality of memory chips and electrically connected with the first bumps, a sub-substrate horizontally disposed on the first substrate together with the plurality of memory chips and electrically connecting the first substrate and the second substrate, and a driving chip having second bumps on one surface thereof and mounted to the second substrate such that the second bumps are electrically connected with the second substrate.

The plurality of memory chips may be constituted by the same kind of memory chips which have substantially similar structures, and may be constituted by at least two kinds of memory chips which have different structures.

The plurality of memory chips may be disposed in a matrix manner when viewed in plan view, and the plurality of memory chips may have major axes aligned parallel to each other. Further, the sub-substrate may be disposed in a direction of the major axes of the memory chips when viewed in plan view, or alternatively, may be disposed in a direction of minor axes of the memory chips when viewed in plan view.

The plurality of memory chips and the sub-substrate may be disposed in a matrix manner when viewed in plan view.

The semiconductor package may further include adhesive members attaching the first substrate and the plurality of memory chip to each other. The semiconductor package may further include: a molding part sealing an upper surface of the first substrate and encompassing the memory chips, the second substrate, the driving chip, and external connection terminals mounted to a lower surface of the first substrate.

The semiconductor package may further include additional memory chips stacked on the first substrate, such as memory chips which belong in a different kind. For example, the memory chips may include DRAM devices, and the additional memory chips may include flash memory devices. Moreover, the semiconductor package may further include wires electrically connecting bonding pads of the additional memory chips with the first substrate, and the additional memory chips may be stacked in a step-like shape such that their bonding pads are exposed. Each of the additional memory chips may have through vias, and may be stacked such that their through vias are connected with one another.

DETAILED DESCRIPTION

Figure 1:
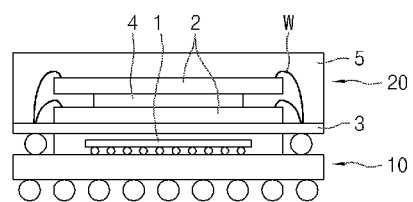
FIGS. 1 and 2 are cross-sectional views illustrating conventional semiconductor packages.
Figure 2:
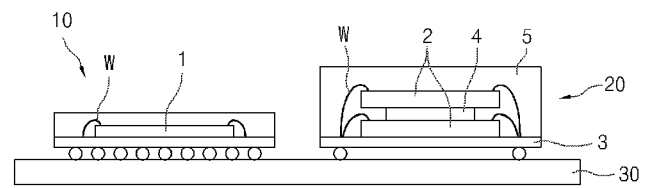

Hereafter, various embodiments will be described in detail with reference to the accompanying drawings.

It is to be understood herein that the drawings are not necessarily to scale and in some instances proportions may have been exaggerated in order to more clearly depict certain features of the invention. Also, the same reference numerals or the same reference designators may denote the same elements throughout the specification.

Figure 3:
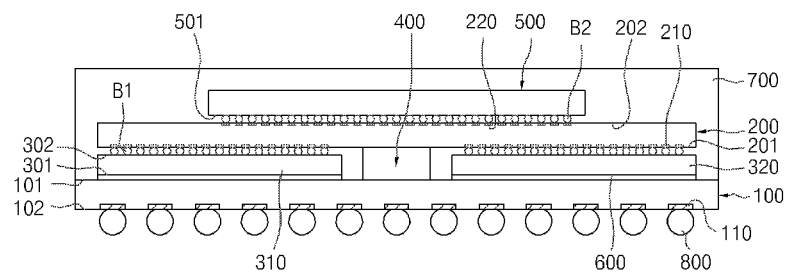
FIG. 3 is a cross-sectional view illustrating a semiconductor package in accordance with a first embodiment of the present invention.
Figure 4:
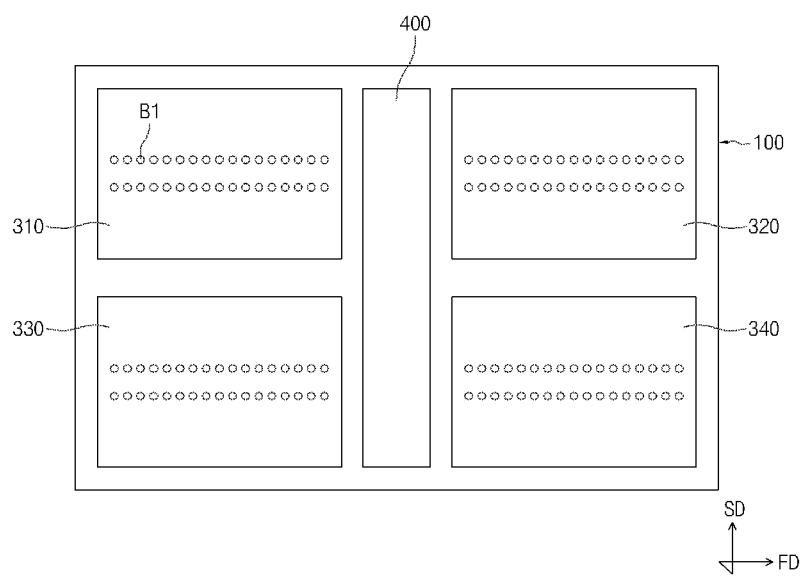
FIG. 4 is a plan view illustrating the memory chips, the sub-substrate, and the first substrate of FIG. 3.

FIG. 3 is a cross-sectional view illustrating a semiconductor package in accordance with a first embodiment, and FIG. 4 is a plan view illustrating the memory chips, the sub-substrate, and the first substrate of FIG. 3.

In FIGS. 3 and 4, the semiconductor package in accordance with the first embodiment includes first and second substrates 100 and 200, a plurality of memory chips 310, 320, 330, and 340, a sub-substrate 400, and a driving chip 500. The semiconductor package further includes adhesive members 600, a molding part 700, and external connection terminals 800.

The first substrate 100 has an upper surface 101 and a lower surface 102 which faces away from the upper surface 101. Ball lands 110 to which the external connection terminals 800 are mounted are formed on the lower surface 102 of the first substrate 100. The external connection terminals 800 may be constituted by solder balls.

The plurality of memory chips 310, 320, 330, and 340 include first, second, third, and fourth memory chips 310, 320, 330, and 340, respectively, which are horizontally mounted on the upper surface 101 of the first substrate 100. In the present embodiment, the first, second, third, and fourth memory chips 310, 320, 330, and 340 are disposed in a matrix manner when viewed in plan view and are arranged such that their major axes are aligned parallel to each other. Hereinafter, for convenience of description, the direction of the major axes of the first, second, third, and fourth memory chips 310, 320, 330, and 340 is defined as a first direction FD, and the direction of the minor axes of the first, second, third, and fourth memory chips 310, 320, 330, and 340 is defined as a second direction SD.

In the present embodiment, the first, second, third, and fourth memory chips 310, 320, 330, and 340 may be constituted by the same kind of memory chips which have substantially similar structures. Each of the first, second, third, and fourth memory chips 310, 320, 330, and 340 has a plurality of first bumps B1 on the other surface 302 which faces away from one surface 301 facing the first substrate 100. The first bumps B1 may be formed in two rows in the direction of the major axis (first direction FD) of each of the first, second, third, and fourth memory chips 310, 320, 330, and 340 on the middle portion of the other surface 302 of each of the first, second, third, and fourth memory chips 310, 320, 330, and 340. Although not shown, each of the first, second, third, and fourth memory chips 310, 320, 330, and 340 has bonding pads on the other surface 302 to which the first bumps B1 are mounted. Thus, each of the first, second, third, and fourth memory chips 310, 320, 330, and 340 has a center pad type structure.

The adhesive members 600 are formed between one surfaces 301 of the first, second, third, and fourth memory chips 310, 320, 330, and 340 and the upper surface 101 of the first substrate 100, and serve to attach the first, second, third, and fourth memory chips 310, 320, 330, and 340 with the first substrate 100. The adhesive members 600 may include any one of a non-conductive film (NCF) and a non-conductive paste (NCP).

The second substrate 200 is disposed on the first, second, third, and fourth memory chips 310, 320, 330, and 340. First connection electrodes 210 are formed on one surface 201 of the second substrate 200 which faces the first, second, third, and fourth memory chips 310, 320, 330, and 340 in such a way as to be electrically connected with first bumps B1 of the first, second, third, and fourth memory chips 310, 320, 330, and 340, and second connection electrodes 220 are formed on the other surface 202 of the second substrate 200 which faces away from the one surface 201.

The sub-substrate 400 is horizontally disposed on the first substrate 100 together with the first, second, third, and fourth memory chips 310, 320, 330, and 340, and is interposed between and electrically connects the first substrate 100 and the second substrate 200. In the present embodiment, when viewed in plan view, the sub-substrate 400 is positioned between an area including first and third memory chips 310 and 330 and an area including the second and fourth memory chips 320 and 340, and extends in the direction of the minor axes (second direction SD) of the first, second, third, and fourth memory chips 310, 320, 330, and 340.

The sub-substrate 400 may be fabricated separately from the first and second substrates 100 and 200 and may subsequently be assembled between the first substrate 100 and the second substrate 200. Alternatively, the sub-substrate 400 may be fabricated separately from the first and second substrates 100 and 200 and may subsequently be connected between the first substrate 100 and the second substrate 200 via bumps. Otherwise, the sub-substrate 400 may be fabricated integrally with the first substrate 100 or the second substrate 200 and may be assembled with the second substrate 200 or the first substrate 100.

The driving chip 500 has second bumps B2 which correspond to the second connection electrodes 220 of the second substrate 200, on one surface 501, and is mounted to the second substrate 200 such that the second bumps B2 are electrically connected with the second connection electrodes 220 of the second substrate 200.

The upper surface 101 of the first substrate 100 on which the memory chips 310, 320, 330, and 340, the sub-substrate 400, the second substrate 200, and the driving chip 500 are stacked, is sealed by the molding part 700.

According to the present embodiment, since memory chips and a driving chip are constructed in one package, the area of a main board may be reduced, and it is possible to avoid unnecessary process steps that are required to fabricate the memory chips and the driving chip as separate packages and to individually mount the separate packages. Further, since a signal transfer length is shortened as the memory chips and the driving chip are directly connected through a second substrate, operation speed may be improved. In addition, because the memory chips are directly connected to substrates thereby not requiring wire bonding, it is possible to prevent an increase in the size of a package, an increase in cost resulting from the use of costly gold wires, an increase in defects resulting from the use of wires, and other various difficulties resulting from the formation of spacers and redistribution lines.

It is to be noted that the present invention is not limited to the aforementioned first embodiment, and modifications may be made in a variety of ways. For example, in order to minimize the size of a package, the position of the sub-substrate and the alignment direction of the memory chips may be modified, and in order to increase capacity, additional memory chips may be further provided. Various such semiconductor packages will be apparent from the following embodiments which will be described with reference to FIGS. 5 to 10.

Figure 5:
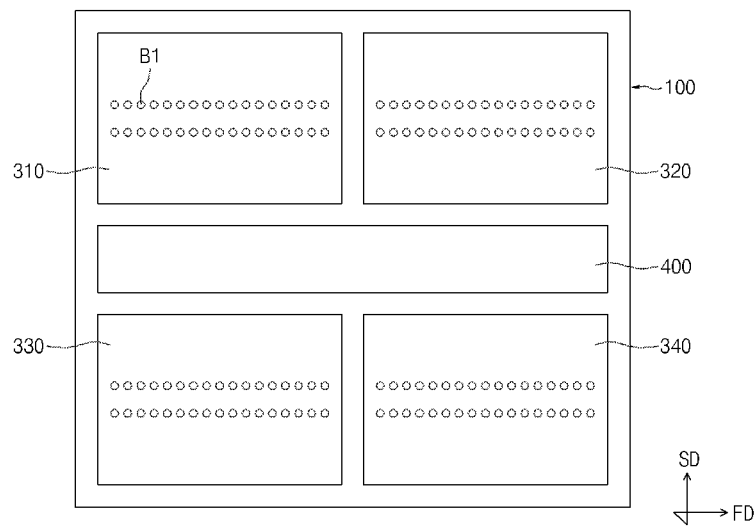
FIG. 5 is a plan view illustrating a semiconductor package in accordance with a second embodiment of the present invention.

FIG. 5 is a plan view illustrating a semiconductor package in accordance with a second embodiment.

The semiconductor package in accordance with the second embodiment features a sub-substrate in a different position compared to the first embodiment described above with reference to FIGS. 3 and 4. Excluding the different position of the sub-substrate, the semiconductor package in accordance with the second embodiment has a substantially similar construction as the semiconductor package in accordance with the first embodiment. Therefore, repeated descriptions for the same component parts will be omitted herein, and the same terms and the same reference numerals will be used to refer to the same component parts.

In the plan view of FIG. 5, a sub-substrate 400 is positioned between an area encompassing first and second memory chips 310 and 320 and an area encompassing third and fourth memory chips 330 and 340 and extends in the direction FD of the major axes of the first, second, third, and fourth memory chips 310, 320, 330, and 340.

According to the present embodiment, when compared to the first embodiment described above with reference to FIGS. 3 and 4, the length of the package in the direction FD of the major axes of the first, second, third, and fourth memory chips 310, 320, 330, and 340 is shortened, and the length of the package in the direction SD of the minor axes of the first, second, third, and fourth memory chips 310, 320, 330 and 340 is lengthened. For example, when the major axis (transverse) length×the minor axis (longitudinal) length of each of the memory chips 310, 320, 330, and 340 is 9×8, the plane size of the package according to the first embodiment may be 22×18, and the plane size of the package according to the second embodiment may be 20×20.

As can be readily seen from the above descriptions, according to the present embodiment, the size of a package may be controlled by appropriately changing the position of the sub-substrate 400 without changing the size of each of the memory chips.

Figure 6:
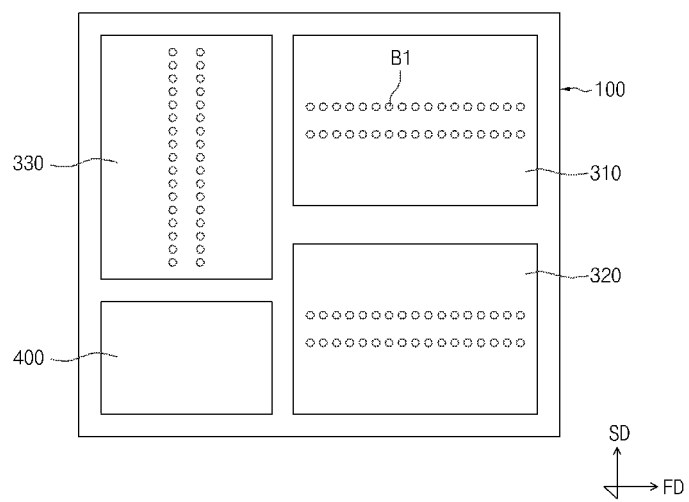
FIG. 6 is a plan view illustrating a semiconductor package in accordance with a third embodiment of the present invention.

FIG. 6 is a plan view illustrating a semiconductor package in accordance with a third embodiment.

The semiconductor package in accordance with the third embodiment has a construction in which the number of memory chips, the alignment direction of the memory chips, and the position of a sub-substrate are modified in comparison with the first embodiment described above with reference to FIGS. 3 and 4. Excluding the memory chips and the substrate, the semiconductor package in accordance with the third embodiment has a substantially similar construction as the semiconductor package in accordance with the first embodiment. Therefore, repeated descriptions for the same component parts will be omitted herein, and the same terms and the same reference numerals will be used to refer to the same component parts.

In FIG. 6, a plurality of memory chips 310, 320, and 330 include three memory chips which are horizontally disposed on a first substrate 100 together with a sub-substrate 400.

In the present embodiment, the first, second, and third memory chips 310, 320, and 330 and the sub-substrate 400 are disposed in a substantial matrix type manner when viewed in plan view. The first and second memory chips 310 and 320 are disposed such that their major axes are parallel to the first direction FD defined in FIG. 6, and the third memory chip 330 is disposed such that its major axis is parallel to the second direction SD that is perpendicular to the first direction FD, in order assist in minimizing the size of the package.

According to the present embodiment, when a design condition such as the number of memory chips is modified, the size of the package may be minimized by appropriately changing the position of a sub-substrate and the layout structure of memory chips.

Figure 7:
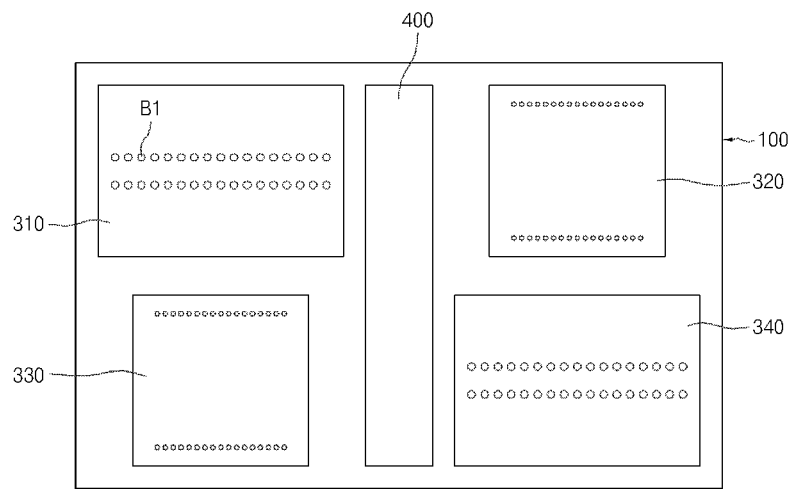
FIG. 7 is a plan view illustrating a semiconductor package in accordance with a fourth embodiment of the present invention.

FIG. 7 is a plan view illustrating a semiconductor package in accordance with a fourth embodiment.

The semiconductor package in accordance with the fourth embodiment features two kinds of memory chips having different structures in comparison with the first embodiment described above with reference to FIGS. 3 and 4. Therefore, repeated descriptions for the same component parts will be omitted herein, and the same terms and the same reference numerals will be used to refer to the same component parts.

In FIG. 7, in the present embodiment, memory chips 310, 320, 330, and 340 are constituted by two kinds of memory chips with different structures.

First and fourth memory chips 310 and 340 have a center pad type structure, and second and third memory chips 320 and 330 have an edge pad type structure. Although it was illustrated and described in the present embodiment that memory chips may be constituted by two kinds of memory chips with different structures, it is to be noted that the present invention is not limited to such and includes not only when all memory chips have the same structure but also when at least two kinds of memory chips with different structures are used.

As can be readily seen, according to the present embodiment, advantages may be provided in that various memory chips with various structures may be used.

Figure 8:
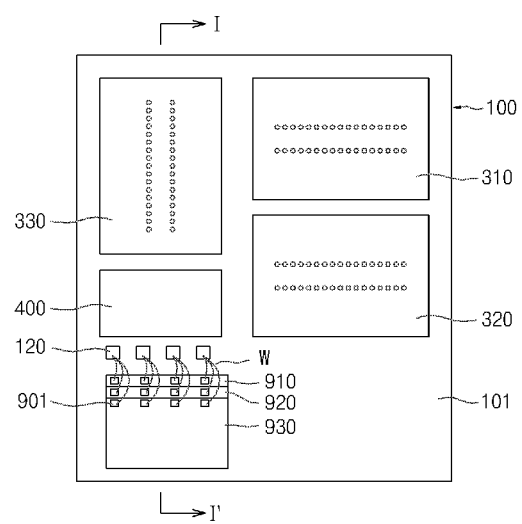
FIG. 8 is a plan view illustrating a semiconductor package in accordance with a fifth embodiment of the present invention.
Figure 9:
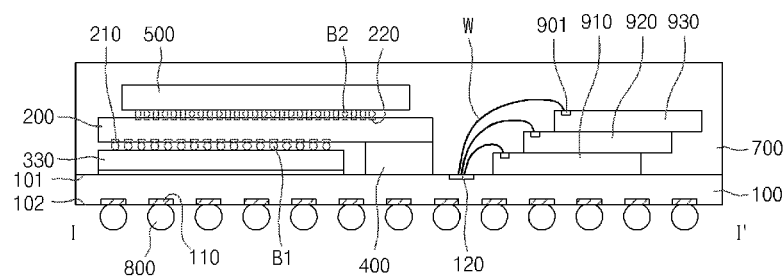
FIG. 9 is a cross-sectional view taken along the line I-I' of FIG. 8.

FIG. 8 is a plan view illustrating a semiconductor package in accordance with a fifth embodiment, and FIG. 9 is a cross-sectional view taken along the line I-I' of FIG. 8.

The semiconductor package in accordance with the fifth embodiment features additional memory chips added to the construction of the third embodiment described above with reference to FIG. 6. Excluding the additional memory chips, the semiconductor package in accordance with the fifth embodiment has a substantially similar construction as the semiconductor package in accordance with the third embodiment. Therefore, repeated descriptions for the same component parts will be omitted herein, and the same terms and the same reference numerals will be used to refer to the same component parts.

Referring to FIGS. 8 and 9, the semiconductor package in accordance with the present embodiment further includes additional memory chips 910, 920, and 930 in addition to the construction of the third embodiment described above with reference to FIG. 6.

In the present embodiment, the additional memory chips 910, 920, and 930 are constituted by first, second, and third memory chips 910, 920, and 930. Each of the first, second, and third memory chips 910, 920, and 930 has bonding pads 901 adjacent to one edge thereof. The first, second, and third memory chips 910, 920, and 930 are stacked on a first substrate 100 in a step-like shape such that bonding pads 901 are exposed.

The first substrate 100 has connection pads 120 which connect to the bonding pads 901 of the first, second, and third memory chips 910, 920, and 930, on an upper surface 101 thereof. The connection pads 120 of the first substrate 100 and the bonding pads 901 of the first, second, and third memory chips 910, 920 and 930 are electrically connected with each other respectively through wires W.

The additional memory chips 910, 920, and 930 may be memory chips which belong to a different kind in comparison with memory chips 310, 320, and 330. For example, the memory chips 310, 320, and 330 may be DRAM devices, and the additional memory chips 910, 920, and 930 may be flash memory devices. Alternatively, the additional memory chips 910, 920, and 930 may be memory chips that are the same kind as the memory chips 310, 320, and 330.

Figure 10:
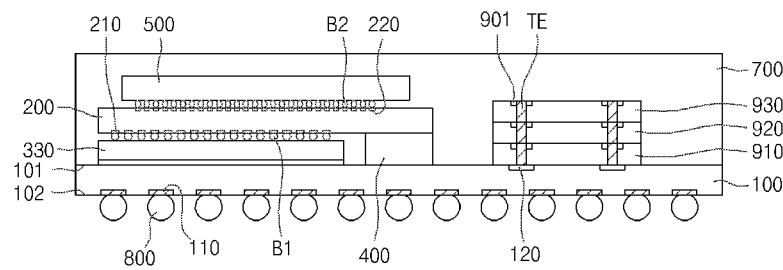
FIG. 10 is a cross-sectional view illustrating a semiconductor package in accordance with a sixth embodiment of the present invention.

FIG. 10 is a cross-sectional view illustrating a semiconductor package in accordance with a sixth embodiment.

The semiconductor package in accordance with the sixth embodiment has a construction where the additional memory chips 910, 920 and 930 are electrically connected with connection pads 120 via through vias TE, unlike the fifth embodiment described above with reference to FIGS. 8 and 9. Excluding the through vias TE, the semiconductor package in accordance with the sixth embodiment has a substantially similar construction as the semiconductor package in accordance with the fifth embodiment. Therefore, repeated descriptions for the same component parts will be omitted herein, and the same terms and the same reference numerals will be used to refer to the same component parts.

Referring to FIG. 10, each additional memory chips 910, 920, and 930 has through vias TE which are electrically connected with bonding pads 901. In the present embodiment, the through vias TE pass through the bonding pads 901. The additional memory chips 910, 920, and 930 are stacked on an upper surface 101 of a first substrate 100 in such a manner that through vias TE are connected with one another and are electrically connected with connection pads 120 of the first substrate 100.

The semiconductor packages according to the above-described embodiments may be applied to various electronic apparatuses.

Figure 11:
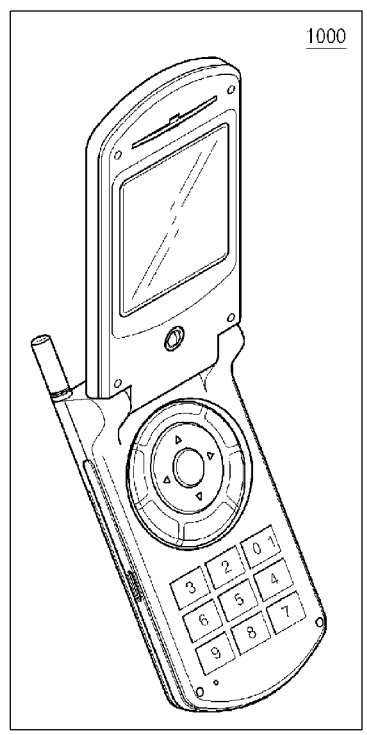
FIG. 11 is a perspective view illustrating an electronic apparatus having a semiconductor package according to various embodiments of the present invention.

FIG. 11 is a perspective view illustrating an electronic apparatus having the semiconductor package according to various embodiments described in the present invention.

In FIG. 11, the semiconductor package according to various embodiments of the present invention may be applied to an electronic apparatus 1000 such as a portable phone. Since the semiconductor package according to various embodiments provides benefits in that it is possible to accomplish a light, slim, compact, and miniaturized structure and prevent a failure from occurring, advantages are provided in terms of reducing the size and improving the reliability of the electronic apparatus 1000. The electronic apparatus 1000 is not limited to the portable phone shown in FIG. 11, and may include various electronic appliances such as a mobile electronic appliance, a laptop computer, a notebook computer, a portable multimedia player (PMP), an MP3 player, a camcorder, a web tablet, a wireless phone, a navigator, a personal digital assistant (PDA), and so forth. Also, the semiconductor package according to various embodiments may be applied to an SD (secure digital) card, a memory stick, an MMC (multimedia card), a CF (compact flash), an SSD (solid state drive), etc., which are used in electronic apparatuses.

Figure 12:
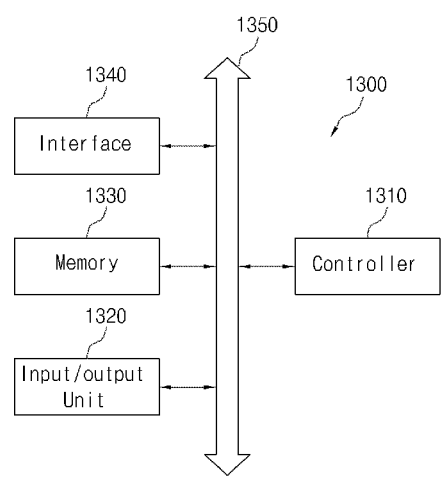
FIG. 12 is a block diagram showing an example of the electronic apparatus having a semiconductor package according to various embodiments of the present invention.

FIG. 12 is a block diagram showing an example of the electronic apparatus having the semiconductor package according to various embodiments of the present invention.

In FIG. 12, an electronic system 1300 may include a controller 1310, an input/output unit 1320, and a memory 1330 which may collectively be coupled with one another through a bus 1350. The bus 1350 serves as a path through which data is transferred. For example, the controller 1310 may include any one of at least one microprocessor, at least one digital signal processor, at least one microcontroller, and logic devices capable of performing the substantially similar functions as these components. The controller 1310 and the memory 1330 may include the semiconductor package according to various embodiments described in the present invention. The input/output unit 1320 may include at one of at least a keypad, at least a keyboard, at least a display device, and so forth. The memory 1330 is a device for storing data, and may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desktop computer. The flash memory may be constituted by a solid state drive (SSD), in which the electronic system 1300 may stably store a large amount of data in a flash memory system. The electronic system 1300 may further include an interface 1340 configured to transmit and receive data to and from a communication network and may be of a wired or wireless type. For example, the interface 1340 may include an antenna or a wired or wireless transceiver. Further, while not shown, a person skilled in the art will readily appreciate that the electronic system 1300 may further include an application chipset, a camera image processor (CIS), etc.

As is apparent from the above descriptions, according to various embodiments of the present invention, since memory chips and a driving chip are constructed in one package, the area of a main board may be reduced, and it is possible to avoid unnecessary process steps required to fabricate the memory chips and the driving chip as separate packages and to individually mount the separate packages. Further, since a signal transfer length between the memory chips and the driving chip is shortened, operation speed may be improved. In addition, because the connection between the memory chips and the driving chip is implemented by a sub-substrate and a second substrate, it is possible to prevent problems due to wire bonding, such as an increase in the size of a package, a cost increase resulting from the use of costly gold wires, an increase in defects resulting from the use of wires, and increased difficulties resulting from the formation of spacers and redistribution lines. Furthermore, greater freedom may be provided in designing systems since various memory chips may be used without limitations in terms of size, shape, and capacity.

Although various embodiments have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
a first substrate;
a plurality of memory chips horizontally disposed on the first substrate, and having one surfaces which face the first substrate, other surfaces which face away from the one surfaces, and first bumps formed on the other surfaces;
a second substrate disposed on the plurality of memory chips and electrically connected with the first bumps;
a sub-substrate horizontally disposed on the first substrate together with the plurality of memory chips and electrically connecting the first substrate and the second substrate; and
a driving chip having second bumps on one surface thereof and mounted to the second substrate such that the second bumps are electrically connected with the second substrate.

2. The semiconductor package according to claim 1, wherein the plurality of memory chips are constituted by the same kind of memory chips which have a substantially similar structures.

3. The semiconductor package according to claim 1, wherein the plurality of memory chips are constituted by at least two kinds of memory chips which have different structures.

4. The semiconductor package according to claim 3, wherein the plurality of memory chips features a center pad type structure.

5. The semiconductor package according to claim 3, wherein the plurality of memory chips features an edge pad type structure.

6. The semiconductor package according to claim 1, wherein the plurality of memory chips are disposed in a matrix manner when viewed in plan view.

7. The semiconductor package according to claim 6, wherein the plurality of memory chips have major axes aligned parallel to each other.

8. The semiconductor package according to claim 7, wherein the sub-substrate is disposed in a direction of the major axes of the memory chips when viewed in plan view.

9. The semiconductor package according to claim 7, wherein the sub-substrate is disposed in a direction of minor axes of the memory chips when viewed in plan view.

10. The semiconductor package according to claim 1, wherein the plurality of memory chips and the sub-substrate are disposed in a matrix manner when viewed in plan view.

11. The semiconductor package according to claim 1, further comprising:
adhesive members attaching the first substrate and the plurality of memory chip to each other.

12. The semiconductor package according to claim 1, further comprising:
a molding part sealing an upper surface of the first substrate and encompassing the memory chips, the second substrate, and the driving chip; and
external connection terminals mounted to a lower surface of the first substrate.

13. The semiconductor package according to claim 1, further comprising:
additional memory chips stacked on the first substrate.

14. The semiconductor package according to claim 13, wherein the additional memory chips are memory chips which belong in a different kind.

15. The semiconductor package according to claim 14, wherein the memory chips comprise DRAM devices, and the additional memory chips comprise flash memory devices.

16. The semiconductor package according to claim 13, further comprising:
wires electrically connecting bonding pads of the additional memory chips with the first substrate.

17. The semiconductor package according to claim 16, wherein the additional memory chips are stacked in a step-like shape such that their bonding pads are exposed.

18. The semiconductor package according to claim 13, wherein each of the additional memory chips has through vias, and the additional memory chips are stacked such that their through vias are connected with one another.

* * * * *